United States Patent
Kuwabara et al.

(10) Patent No.: US 8,481,629 B2
(45) Date of Patent: Jul. 9, 2013

(54) SURFACE MOUNT ADHESIVE, MOUNTING STRUCTURE INCLUDING THE SAME, AND METHOD FOR PRODUCING MOUNTING STRUCTURE

(75) Inventors: Ryo Kuwabara, Osaka (JP); Atsushi Yamaguchi, Osaka (JP); Hidenori Miyakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 427 days.

(21) Appl. No.: 12/431,303

(22) Filed: Apr. 28, 2009

(65) Prior Publication Data

US 2009/0277678 A1 Nov. 12, 2009

(30) Foreign Application Priority Data

May 8, 2008 (JP) ................................. 2008-122268

(51) Int. Cl.
- *C04B 26/06* (2006.01)
- *C08K 3/10* (2006.01)
- *C08K 3/34* (2006.01)
- *C08J 3/22* (2006.01)
- *H05K 1/02* (2006.01)

(52) U.S. Cl.
USPC ........................... 524/437; 524/451; 174/259

(58) Field of Classification Search
USPC .................................. 174/260; 524/437, 451
See application file for complete search history.

(56) References Cited

U.S. PATENT DOCUMENTS

| | | | | |
|---|---|---|---|---|
| 5,250,591 A | * | 10/1993 | Fujii et al. | 523/521 |
| 5,391,924 A | * | 2/1995 | Uchida et al. | 257/789 |
| 6,770,957 B2 | * | 8/2004 | Yamamoto | 257/666 |
| 6,784,541 B2 | * | 8/2004 | Eguchi et al. | 257/723 |
| 7,025,852 B2 | * | 4/2006 | Kumakura | 156/307.3 |
| 2008/0122088 A1 | * | 5/2008 | Todd et al. | 257/741 |
| 2010/0076119 A1 | * | 3/2010 | Ishizawa et al. | 523/400 |

FOREIGN PATENT DOCUMENTS

| | | |
|---|---|---|
| JP | 2001-135927 | 5/2001 |
| WO | WO 99/60622 | 11/1999 |

OTHER PUBLICATIONS

Crystal quartz (SiO2) and Fused Silica (http://www.mt-berlin.com/frames_cryst/descriptions/quartz%20.htm, 2012).*

* cited by examiner

*Primary Examiner* — Liam Heincer
(74) *Attorney, Agent, or Firm* — McDermott Will & Emery LLP

(57) ABSTRACT

A surface mount adhesive includes an epoxy resin, a curing agent, an accelerator, a first filler, and a second filler. The second filler has a specific gravity 1.1 to 3 times that of the first filler, and the second filler has a hardness higher than that of the first filler. The first filler has a largest particle size of 1 to 100 μm, and the second filler has a largest particle size of 1 to 100 μm, a specific gravity of 1.7 to 4.5, and a revised Mohs hardness of 2 to 12. The weight ratio of the first filler to the second filler is from 1:3 to 3:1, and the surface mount adhesive has a specific gravity of 1.2 to 1.5. When the surface mount adhesive is dispensed, dispensing failures are suppressed, and dispensing stability is improved.

9 Claims, 2 Drawing Sheets

SURFACE MOUNT ADHESIVE, MOUNTING STRUCTURE INCLUDING THE SAME, AND METHOD FOR PRODUCING MOUNTING STRUCTURE

FIELD OF THE INVENTION

The invention relates to a surface mount adhesive used to fix electronic components to circuit boards for electric products, a mounting structure using the surface mount adhesive, and a method for producing a mounting structure.

BACKGROUND OF THE INVENTION

With the recent trend of electronic devices toward higher performance, circuit boards have been required to be thinner, and electronic components have been required to be mounted more densely. To meet such requirements, electronic components such as chip components, CSPs (chip size packages), and ICs have been designed to be smaller and provide higher performance, and circuit boards have been provided with narrow pitch wiring to achieve micro wiring. This has lead to higher packing density of electronic components and rising prices per electronic component. Further, due to increased added value per circuit board with electronic components mounted thereon, prices per circuit board also tend to rise.

When an electronic component is mounted on a circuit board, a thermosetting adhesive is dispensed to a predetermined position of the circuit board, and the electronic component is placed at the predetermined position. Heat is then applied to cure the thermosetting adhesive, so that the component is temporarily fixed to the predetermined position of the circuit board. Flux is then applied to the area of the circuit board to be connected with the electronic component, and the circuit board is immersed in molten solder. As a result, the electronic component is electrically connected to the circuit board to obtain a mounting structure.

Dispensing methods of surface mount adhesives include, for example, the air method and the screw method. The air method utilizes air pressure to feed a surface mount adhesive from a syringe to a nozzle. Since the air method utilizes only air pressure to control the amount of a surface mount adhesive applied, the applied amount tends to vary and become unstable with a decrease of the amount of the surface mount adhesive inside the syringe.

The screw method utilizes air pressure and screw rotation to dispense a surface mount adhesive to a predetermined position. Since the screw method utilizes air pressure and a screw to control the applied amount, the applied amount becomes more stable. Hence, when a surface mount adhesive is dispensed with the application area diameter set to, for example, approximately 0.6 mm, the screw method is commonly used as in JP A No. 2001-135927.

WO 99/60622 proposes an insulating adhesive for a semiconductor chip, wherein a resin into which a filler is to be dispersed has a fixed mean molecular weight or viscosity.

The surface mount adhesives of JP A No. 2001-135927 and WO 99/60622 contain a filler. Since the dispensing of a surface mount adhesive is conducted at a high speed cycle of approximately 0.07 s/shot, the following dispensing failures may occur unless the physical properties of the filler are optimized.

First, when a nozzle is brought into contact with a circuit board to dispense a surface mount adhesive to the circuit board, the nozzle is pressed against the circuit board, and thus part of the surface mount adhesive being dispensed may splash due to pressure.

Second, if the surface mount adhesive is not smoothly dropped on the circuit board, the surface mount adhesive may splash or tail (string) when the nozzle moves from one position to another to dispense the surface mount adhesive.

Third, if the wettability of the surface mount adhesive relative to the nozzle is insufficient, the surface mount adhesive may adhere or stick to the nozzle if it is continuously dispensed. This may cause the applied amount to become unstable or cause a nozzle clogging.

BRIEF SUMMARY OF THE INVENTION

In order to solve the problems as described above, an object of the invention is to suppress the occurrence of problems in dispensing a surface mount adhesive and enable stable dispensing.

In view of the above problems, the invention provides a surface mount adhesive including an epoxy resin, a curing agent, an accelerator, a first filler, and a second filler. The second filler has a specific gravity 1.1 to 3 times that of the first filler, and the second filler has a hardness higher than that of the first filler. The first filler has a largest particle size of 1 to 100 μm, and the second filler has a largest particle size of 1 to 100 μm, a specific gravity of 1.7 to 4.5, and a revised Mohs hardness of 2 to 12. The weight ratio of the first filler to the second filler is from 1:3 to 3:1, and the surface mount adhesive has a specific gravity of 1.2 to 1.5.

In the invention, in addition to the first filler, the surface mount adhesive further includes the second filler that is relatively high in specific gravity and hardness. Hence, the specific gravity of the whole surface mount adhesive becomes high, and the surface mount adhesive can be dispensed more stably. Further, problems such as splashing and tailing of the surface mount adhesive occurring when the dispenser moves can be suppressed, and the amount of the surface mount adhesive applied can be stabilized.

The first filler preferably has a specific gravity of 1.5 to 3.

The first filler preferably has a revised Mohs hardness of 1 to 3.

The first filler is preferably talc, and the second filler is preferably alumina.

The first filler preferably has a mean particle size of 0.5 to 50 μm.

The second filler preferably has a mean particle size of 0.5 to 80 μm.

The surface mount adhesive of the invention is particularly useful when it is cured at 90 to 150° C.

The invention also provides a mounting structure including: a circuit board; an electronic component disposed on a predetermined area of the circuit board; the above-described surface mount adhesive that is cured and disposed between the circuit board and the electronic component; and solder electrically connecting the circuit board with the electronic component.

The invention further provides a method for producing a mounting structure, including the steps of: dispensing the above-described surface mount adhesive to a predetermined area of a circuit board; disposing an electronic component on the predetermined area of the circuit board having the surface mount adhesive; and heating the circuit board at a predetermined temperature to cure the surface mount adhesive.

According to the invention, when a surface mount adhesive, in particular, a surface mount adhesive that cures at low temperatures of 90 to 150° C., is dispensed to a circuit board, dispensing failures can be suppressed. Further, since the adhesion of the surface mount adhesive to the nozzle can be suppressed, the amount of the surface mount adhesive applied to the circuit board can be stabilized.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

The surface mount adhesive of the invention includes a first filler and a second filler that is relatively high in specific gravity and hardness. The whole surface mount adhesive thus has a high specific gravity, and the surface mount adhesive can be dispensed more stably. Further, splashing, tailing, etc. of the surface mount adhesive occurring when the dispenser moves are suppressed, and the amount of the surface mount adhesive applied can be stabilized.

When the surface mount adhesive includes only the second filler with a high hardness, the thixotropy of the surface mount adhesive lowers, so the surface mount adhesive tends to drip from the nozzle. On the other hand, if the surface mount adhesive includes only the first filler with a low hardness, the surface mount adhesive excessively adheres to the nozzle.

The surface mount adhesive of the invention includes an epoxy resin, a curing agent, an accelerator, a first filler, and a second filler, and the specific gravity of the second filler is 1.1 to 3 times that of the first filler, and the hardness of the second filler is higher than that of the first filler. The specific gravity of the second filler is preferably 1.1 to 1.5 times that of the first filler.

The surface mount adhesive is fluid at room temperature, and cures when heated to a predetermined temperature. The cured surface mount adhesive is solid and usually viscoelastic. Due to these characteristics, the surface mount adhesive is suited, for example, as the adhesive for fixing an electronic component to a circuit board in a production process of a mounting structure. Methods for dispensing a surface mount adhesive to a circuit board include the air method and the screw method, and the screw method is preferable.

Figure 1:
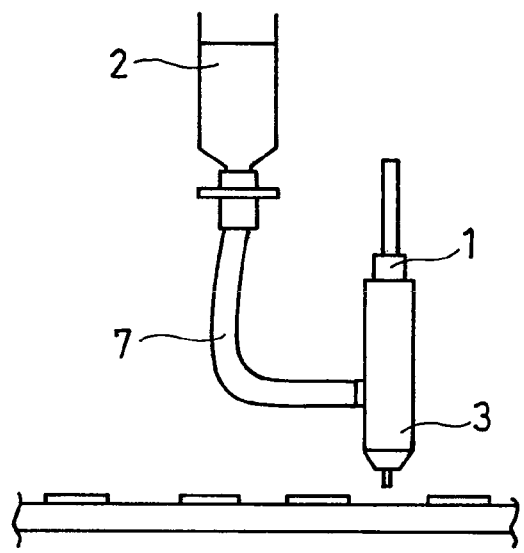
FIG. 1 is a schematic view of an exemplary dispenser for a surface mount adhesive.
Figure 2:
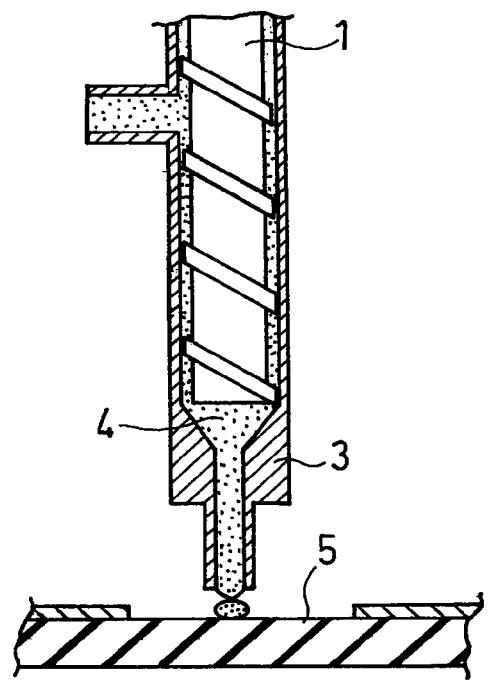
FIG. 2 is a partially sectional view of the main part of the dispenser of FIG. 1.

FIG. 1 is a schematic view of an exemplary screw type dispenser for a surface mount adhesive, and FIG. 2 is a partially sectional view of the main part of the dispenser of FIG. 1. The dispenser of FIG. 1 includes a screw 1, a syringe 2, a nozzle 3, and a tube 7. The syringe 2 is connected to the nozzle 3 by the tube 7. The syringe 2 is filled with a surface mount adhesive 4, and the surface mount adhesive 4 is supplied to the nozzle 3 from the syringe 2 via the tube 7 due to air pressure. The nozzle 3 contains the screw 1 that is rotatable. The surface mount adhesive 4 supplied from the syringe 2 is filled between the screw 1 and the inner side faces of the nozzle 3.

Rotation of the screw 1 causes the surface mount adhesive 4 to be ejected from the nozzle 3 and dispensed to the circuit board 5. By changing the rotation speed of the screw 1, the amount of the surface mount adhesive 4 ejected therefrom can be controlled.

The specific gravity of the whole surface mount adhesive of the invention is 1.2 to 1.5. If the specific gravity as a whole is less than 1.2, the dropping property of the surface mount adhesive deteriorates, which may make stable dispensing difficult. On the other hand, if the specific gravity as a whole exceeds 1.5, the dispersibility of the fillers in the surface mount adhesive lowers. Thus, sedimentation may occur in the surface mount adhesive, thereby making dispensing difficult.

The specific gravity of the first filler is preferably 1.5 to 3. If the specific gravity of the first filler is less than 1.5, the viscosity of the surface mount adhesive can be suitably increased, but the improvement in the dropping property of the surface mount adhesive may become insufficient.

The revised Mohs hardness of the first filler is preferably 1 to 3. If the revised Mohs hardness of the first filler is less than 1, the adhesion between the nozzle and the surface mount adhesive may become too strong, thereby making stable dispensing difficult. As used herein, revised Mohs hardness refers to a scale of hardness of substances starting with talc at 1 and ending with diamond at 15.

The mean particle size (D50) of the first filler is preferably 0.5 to 50 µm, and more preferably 0.5 to 10 µm. If the mean particle size is less than 0.5 µm, the change in the viscosity of the surface mount adhesive at room temperature may become excessive. On the other hand, if the mean particle size exceeds 50 µm, the tip of the nozzle may clog during dispensing, thereby making stable dispensing difficult. By making the mean particle size of the first filler 0.5 to 50 µm, preferably 0.5 to 10 µm, the dispensing properties and storage stability of the surface mount adhesive are significantly improved, which permits stable dispensing over an extended period of time.

Examples of the first filler include talc, aluminum hydroxide, activated carbon, carbon black, magnesium oxide, magnesium hydroxide, baking soda (sodium hydrogen carbonate), slaked lime (calcium hydroxide), gypsum (calcium sulfate), and mica. Among them, the use of talc is preferable.

The specific gravity of the second filler is 1.7 to 4.5, and preferably 3 to 4. If the specific gravity of the second filler exceeds 4.5, the dispersibility of the second filler in the surface mount adhesive lowers, so sedimentation of the filler inside the adhesive may occur.

The revised Mohs hardness of the second filler is 2 to 12. If the revised Mohs hardness of the second filler exceeds 12, the thixotropy of the surface mount adhesive may decrease, thereby making stable dispensing difficult.

The mean particle size (D50) of the second filler is preferably 0.5 to 80 µm, more preferably 10 to 50 µm, and even more preferably 10 to 20 µm. If the mean particle size is less than 0.5 µm, the change in the viscosity of the surface mount adhesive at room temperature may become excessive. On the other hand, if the mean particle size exceeds 80 µm, the tip of the nozzle may clog during dispensing, thereby making stable dispensing difficult. By making the mean particle size of the second filler 0.5 to 80 µm, preferably 10 to 50 µm, and more preferably 10 to 20 µm, the dispensing properties and storage stability of the surface mount adhesive are significantly improved, which permits stable dispensing over an extended period of time.

Examples of the second filler include aluminum, alumina, activated alumina, quartz sand, titanium oxide, and silica. Among them, the use of alumina is preferable.

Each of the first filler and the second filler has a largest particle size of 1 to 100 μm, and preferably 1 to 10 μm. If the largest particle size is less than 1 μm, the change in the viscosity of the surface mount adhesive at room temperature may become excessive. On the other hand, if the largest particle size exceeds 100 μm, the tip of the nozzle may clog during dispensing, thereby making stable dispensing difficult.

The weight ratio of the first filler to the second filler is from 1:3 to 3:1, and preferably from 1:1.5 to 1:1. If the weight ratio of the first filler to the second filler exceeds 3, the surface mount adhesive may excessively adhere to the nozzle, thereby making the applied amount unstable. On the other hand, if the weight ratio of the second filler to the first filler exceeds 3, the thixotropy of the surface mount adhesive lowers, so the surface mount adhesive may tend to drip from the nozzle. By making the weight ratio of the first filler to the second filler from 1:3 to 3:1, and preferably from 1:1.5 to 1:1, the dispensing properties and storage stability of the surface mount adhesive are significantly improved, which permits stable dispensing over an extended period of time.

The cured surface mount adhesive of the invention has a glass transition point (Tg) of 20 to 120° C., preferably 30 to 100° C., and more preferably 35 to 80° C. If the glass transition point is less than 20° C., the electronic component may not be sufficiently fixed. On the other hand, if the glass transition point exceeds 120° C., the repairability of the circuit board may decrease.

Examples of epoxy resins include bisphenol A epoxy resins, bisphenol F epoxy resins, novolac epoxy resins, alicyclic epoxy resins, glycidyl ester epoxy resins, glycidyl amine epoxy resins. They may be used singly or in combination of two or more of them. Among them, the use of a mixture of a bisphenol A epoxy resin and a bisphenol F epoxy resin is preferable in terms of improving low temperature curability and repairability.

While the curing agent is not particularly limited, it is preferable to use, for example, amine curing agents and thiol curing agents. Examples of amine curing agents include diethylene triamine, triethylenetetramine, tetraethylenepentamine, dipropylenediamine, menthanediamine, isophoronediamine, methaphenylenediamine, diaminodiphenylmethane, and diaminodiphenylsulfone.

Examples of thiol curing agents include compounds selected from 3-mercaptopropionic acid, methoxybutyl mercaptopropionate, octyl mercaptopropionate, tridecyl mercaptopropionate, trimethylolpropane tristhiopropionate, and glycolic acid derivatives such as pentaerythritol tetrakis thioglicolate, trimethylolpropane tristhioglicolate, and butanediol bisthioglicolate. They may be used singly or in combination of two or more of them.

The amount of the curing agent is preferably 30 to parts by weight per 100 parts by weight of the epoxy resin. If the amount of the curing agent is less than 30 parts by weight, the curing temperature of the surface mount adhesive may become too high. On the other hand, if the amount of the curing agent exceeds 200 parts by weight, the storage stability of the surface mount adhesive may lower.

While the accelerator is not particularly limited, it is preferable to use, for example, imidazole accelerators. Examples of imidazole accelerators include 2-methyl imidazole, 2-ethyl-4-methyl imidazole and derivatives thereof, trimellitates of imidazole derivatives, and isocyanurates of imidazole derivatives. They may be used singly or in combination of two or more of them.

The amount of the accelerator is preferably 0.5 to 20 parts by weight per 100 parts by weight of the epoxy resin. If the amount of the accelerator is less than 0.5 part by weight, the curing temperature of the surface mount adhesive may become too high. On the other hand, if the amount of the accelerator exceeds 20 parts by weight, the storage stability of the surface mount adhesive may lower.

The method for preparing the surface mount adhesive is described.

A base resin is prepared by mixing an epoxy resin, a curing agent, and an accelerator. The base resin is mixed with a first filler and a second filler, and the resultant mixture is defoamed to obtain a surface mount adhesive. The means and devices used for the mixing and defoaming are not particularly limited, and can be suitably selected by one with ordinary skill in the art.

The weight ratio of the base resin to the fillers (the total of the first filler and the second filler) is preferably from 1.5:1 to 3:1, and more preferably 1.5:1 to 2:1, in term of the viscosity and thixotropy of the surface mount adhesive. By making the weight ratio of the base resin to the fillers from 1.5:1 to 3:1, preferably from 1.5:1 to 2:1, the dispensing properties and storage stability of the surface mount adhesive are significantly improved, which permits stable dispensing over an extended period of time.

Figure 3:
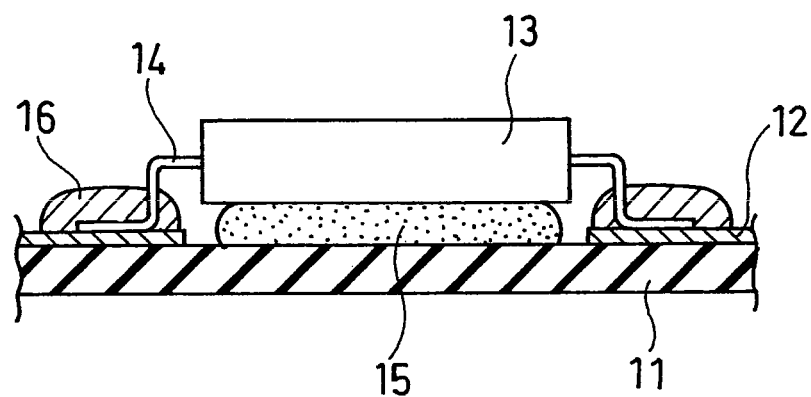
FIG. 3 is a schematic sectional view of an exemplary mounting structure including a surface mount adhesive of the invention.

Next, the mounting structure of the invention is described. FIG. 3 is a schematic sectional view of an exemplary mounting structure. The mounting structure includes a circuit board 11 with wiring 12, an electronic component 13 with leads 14, a cured surface mount adhesive 15 disposed between the circuit board 11 and the electronic component 13, and solder 16. The electronic component 13 is disposed on the circuit board 11 such that the positions of the leads 14 correspond to the wiring 12. The wiring 12 of the circuit board 11 is electrically connected to the leads 14 of the electronic component 13 by the solder 16. Examples of electronic components include, but are not particularly limited to, charge-coupled devices (CCDs), hologram devices, and chip components. Such a mounting structure is contained in devices such as DVDs, cell phones, portable AV devices, and digital cameras. Since the above-described surface mount adhesive has good dispensing properties, the productivity of the mounting structure significantly improves.

The method for producing the mounting structure of the invention includes the steps of: dispensing the above-described surface mount adhesive to a predetermined area of a circuit board; disposing an electronic component on the predetermined area of the circuit board having the surface mount adhesive; and heating the circuit board at a predetermined temperature to cure the surface mount adhesive.

The surface mount adhesive is dispensed to a predetermined area of a circuit board by the screw method or the like. An electronic component is disposed on the area to which the surface mount adhesive has been dispensed by a mounting machine or the like. At this time, the electronic component is disposed such that the positions of their leads correspond to the wiring of the circuit board. Thereafter, using a reflow furnace or the like, the surface mount adhesive is cured at a predetermined temperature, for example, 90 to 150° C., to fix the electronic component to the circuit board. Then, for example, through a flow soldering, the leads of the electronic component are soldered to the wiring of the circuit board, to obtain a mounting structure.

When a conventional filler is used in a surface mount adhesive that cures at relatively low temperatures such as 90 to 150° C., the nozzle of the dispenser tends to clog. However, according to the invention, since the fillers are blended appropriately, even when the surface mount adhesive is cured at lower-than-usual temperatures, for example, 120° C. or less, or even 100° C. or less, nozzle clogging can be significantly suppressed. Therefore, the surface mount adhesive of the invention is particularly effective for low temperature curing. Although the detailed reason why nozzle clogging can be suppressed is not yet clear, the reason is probably as follows. The surface mount adhesive including the first filler and the second filler has a suitable specific gravity. Hence, when the surface mount adhesive is dispensed, it exhibits a good dropping property, and its residues are unlikely to adhere to the nozzle.

EXAMPLES

The invention is hereinafter described specifically by way of Examples and Comparative Examples.

Using the following components, the surface mount adhesives of Examples and Comparative Examples were prepared.

1. Base resin: XBM5000 of AJINOMOTO CO., INC. containing a liquid epoxy resin, a curing agent and an accelerator
   Liquid epoxy resin: bisphenol A/F mixed resin
   Curing agent: amine-type
   Accelerator: imidazole-type
2. First filler: talc
3. Second filler: alumina, silica gel, zircon, or silicon carbide The characteristics of the respective fillers are shown in Table 1.

TABLE 1

|  | Largest particle size (μm) | Specific gravity | Revised Mohs hardness |
|---|---|---|---|
| Talc | 10 | 2.7 | 1 |
| Alumina | 0.1 to 150 | 3.9 | 12 |
| Silica gel | <0.1 | <1 | — |
| Zircon | 80 | 4.7 | 7.5 |
| Silicon carbide | 90 | 3.2 | 13 |

The base resin XBM5000 was fully mixed with the first filler and the second filler, and the mixture was defoamed to prepare a surface mount adhesive.

The first filler used was talc, which is relatively inexpensive. The largest particle size of the talc was set to 10 μm. The talc used is a powder prepared by crushing massive talc. Talc is a kind of silicate minerals, and its composition formula is represented by $Mg_3Si_4O_{10}(OH)_2$. It is white or light green, and is one of the softest minerals. The characteristics of talc are shown in Table 2.

TABLE 2

| Name | Talc |
|---|---|
| Composition formula | $Mg_3Si_4O_{10}(OH)_2$ |
| Kind | Silicate mineral |
| Largest particle size | 10 μm |
| Specific gravity | 2.7 |
| Revised Mohs hardness | 1 |
| Color | White, Light green |
| Crystal system | Monoclinic, Triclinic |
| Bulk density | 0.48 |

The surface mount adhesives thus obtained were evaluated for the following characteristics (a) to (c). The dispensing conditions of the surface mount adhesives were set to a dispensing temperature of 35° C., a dispensing pressure of 0.14 MPa, and a screw rotation speed of 160 rpm.

(a) Stably Stored Period

Using an E-type viscometer (RC-550 available from TOKI SANGYO CO., LTD.), the viscosity N0 of each of the surface mount adhesives immediately after the preparation thereof was measured. After the surface mount adhesive was stored in a constant temperature bath at 10±1° C., the viscosity N1 was measured at the same temperature every predetermined period of time. The storage period when the measured viscosity N1 satisfied the relation: $N1 \geq 1.2 \times N0$ was defined as the stably stored period for the surface mount adhesive. When the stably stored period was 180 days or more, the surface mount adhesive was determined as having a preferable storage period.

(b) Dispensing Properties

Each of the surface mount adhesives was supplied to a screw-type adhesive dispenser (high speed dispenser NM-DC15 available from Panasonic Factory Solutions Inc., Ltd.) equipped with a one-shot nozzle of 0.33 mm in diameter. After the surface mount adhesive was left for 10 minutes, it was dispensed to a circuit board. For the dispensing, 10000 dots of each surface mount adhesive were applied. The permissible range of application area diameter was set to 0.6±0.1 mm. A board with a resist applied thereon (100×200 mm, thickness 1.6 mm) was used as a circuit board, and 1000 dots were applied per circuit board. Under these conditions, the Cp (process capability index) value for each surface mount adhesive and the number of dots with dispensing failure were obtained. The process capability index was determined as {(upper limit value of permissible range)−(lower limit value of permissible range)}/6×(standard deviation of application area diameter).

The number of dots with dispensing failure of each surface mount adhesive was determined as follows.

When the surface mount adhesive dripped from the nozzle after 10 minutes, or when the surface mount adhesive could not be ejected from the nozzle after 10 minutes (clogging), such a case was defined as NG.

Figure 4:
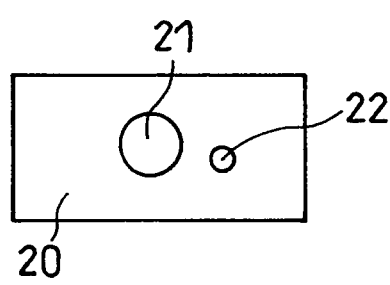
FIG. 4 is a schematic view of an example of splashing failure in dispensing a surface mount adhesive.

FIG. 4 illustrates an example of splashing failure. When a surface mount adhesive splashed to an area 22 of a circuit board 20 away from a targeted area 21, such a case was defined as splashing failure.

Figure 5:
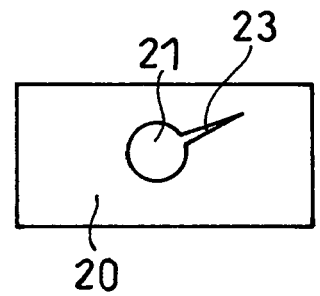
FIG. 5 is a schematic view of an example of tailing failure in dispensing a surface mount adhesive.

FIG. 5 illustrates an example of tailing failure. When a surface mount adhesive applied to the circuit board 20 had a tail 23 that protruded from the circumference of the targeted area 21 by 0.2 mm or more, such a case was defined as tailing failure.

When the Cp value was 1.3 or more and the number of dots with dispensing failure per circuit board was 5 or less, the surface mount adhesive was determined as having preferable dispensing properties.

(c) Continuous Dispensing Stability

In the same manner as described in (b) above, 10000 dots of each surface mount adhesive were applied every day, and how many days the surface mount adhesive could be dispensed stably was evaluated. The number of days when the number of dots with dispensing failure per circuit board exceeded 5 was recorded. When a surface mount adhesive could be stably dispensed for 7 days, the surface mount adhesive was determined as having preferable continuous dispensing stability.

Each of the surface mount adhesives was comprehensively evaluated based on the results of the above (a) to (c). Specifically, when the stably stored period was 180 days or more, the Cp value was 2 or more, and the stably dispensed period was 20 days or more, the comprehensive evaluation was expressed as "very good".

When the stably stored period was 180 days or more, the Cp value was 2 or more, and the stably dispensed period was 15 to 19 days, the comprehensive evaluation was expressed as "good".

When the stably stored period was less than 100 days, the Cp value was less than 1.0, or the stably dispensed period was less than 7 days, the comprehensive evaluation was expressed as "poor".

Examples 1 to 3 and Comparative Examples 1 to 2

The particle size of the second filler was examined.

Alumina was used as the second filler, and the weight ratio of the first filler to the second filler was set to 1:2. The weight ratio of the base resin to the fillers was set to 2:1. The largest particle size of alumina was set to 0.1, 1, 10, 100, or 150, and evaluations were made. Table 3 shows the results.

TABLE 3

|  |  | Ex 1 | Ex 2 | Ex 3 | Comp. Ex 1 | Comp. Ex 2 |
|---|---|---|---|---|---|---|
| Second filler |  |  |  | Alumina |  |  |
| Largest particle size (μm) |  | 1 | 10 | 100 | 0.1 | 150 |
| Filler weight ratio (Talc:Alumina) |  |  |  | 1:2 |  |  |
| Specific gravity of whole surface mount adhesive |  |  |  | 1.42 |  |  |
| Stably stored period (days) |  | 180 days or more | 180 days or more | 180 days or more | 64 | 180 days or more |
| Dispensing properties | Dripping, Clogging | None | None | None | NG (Clogging) | NG (Dripping) |
|  | Cp values | 2.25 | 2.13 | 2.18 | 0.64 | 0.72 |
|  | Number of dots with tailing | 0 | 0 | 0 | 8 | 6 |
|  | Number of dots with splashing | 0 | 1 | 0 | 12 | 10 |
| Stably dispensed period (days) |  | 18 | 22 | 19 | 3 | 5 |
| Comprehensive evaluation |  | Good | Very good | Good | Poor | Poor |

When the largest particle size of alumina was 0.1 μm, the change in the viscosity of the surface mount adhesive at room temperature tended to increase. Thus, the stably stored period was short, and the dispensing properties also deteriorated. On the other hand, when the largest particle size of the second filler was 150 μm, the change in the viscosity of the surface mount adhesive was small, and the stably stored period was long. However, since the particle size of the second filler was too large, the tip of the nozzle clogged, and thus the dispensing properties deteriorated.

When the largest particle size of the second filler was 1 μm, 10 μm, or 100 μm, it was possible to suppress the change in the viscosity of the surface mount adhesive at room temperature while suppressing the clogging of the nozzle tip. These surface mount adhesives had a stably stored period of 180 days or more and good dispensing properties.

Example 4 and Comparative Examples 3 to 5

The specific gravity and hardness of the second filler were examined.

Alumina (Example 4) having a largest particle size of 10 μm, silica gel (Comparative Example 3), zircon (Comparative Example 4), or silicon carbide (Comparative Example 5) was used as the second filler. The weight ratio of the first filler to the second filler was set to 1:2. The weight ratio of the base resin to the fillers was set to 2:1, and evaluations were made. Table 4 shows the results.

TABLE 4

|  |  | Ex 4 | Comp. Ex 3 | Comp. Ex 4 | Comp. Ex 5 |
|---|---|---|---|---|---|
| Second filler |  | Alumina | Silica gel | Zircon | Silicon carbide |
| Largest particle size (μm) |  | 10 | <0.1 | 80 | 90 |
| Specific gravity |  | 3.9 | <1 | 4.7 | 3.2 |
| Revised Mohs hardness |  | 12 | — | 7.5 | 13 |
| Filler weight ratio (Talc:Second filler) |  |  |  | 1:2 |  |
| Specific gravity of whole surface mount adhesive |  | 1.42 | — | 1.44 | 1.40 |
| Stably stored period (days) |  | 180 days or more | 12 | 118 | 152 |
| Dispensing properties | Dripping, Clogging | None | NG (Clogging) | NG (Dripping) | NG (Dripping) |
|  | Cp values | 2.13 | 0.43 | 0.68 | 0.73 |
|  | Number of dots with tailing | 0 | 152 | 53 | 32 |
|  | Number of dots with splashing | 1 | 78 | 27 | 113 |
| Stably dispensed period (days) |  | 22 | 0 | 5 | 0 |
| Comprehensive evaluation |  | Very good | Poor | Poor | Poor |

The specific gravity of the second filler is examined.

When the surface mount adhesive contained silica gel with a specific gravity of less than 1, the change in the viscosity of the surface mount adhesive was too large. Thus, the stably stored period was extremely short, and stable dispensing was not possible.

When the surface mount adhesive contained zircon with a specific gravity of higher than 4.5 (zircon's specific gravity 4.7), the dispersibility of zircon in the base resin lowered, and thus the sedimentation of the filler occurred in the surface mount adhesive. Hence, although the stably stored period was somewhat long, stable dispensing was not possible.

When the surface mount adhesive contained alumina with a specific gravity of 4.5 or less (alumina's specific gravity 3.9), the dispersibility of alumina was not impaired and the dropping property was improved. Thus, the surface mount adhesive had a stably stored period of 180 days or more and good dispensing properties.

The hardness of the second filler is examined.

When the surface mount adhesive contained silicon carbide with a revised Mohs hardness of 13, the hardness of the whole mixture of the fillers became high and the thixotropy could not be maintained. Thus, the wettability of the surface mount adhesive relative to the nozzle decreased and the dripping of the surface mount adhesive was found. As a result, stable dispensing was not possible. On the other hand, when the surface mount adhesive contained alumina with a revised Mohs hardness of 12, the thixotropy was maintained suitably. Hence, the wettability relative to the nozzle did not decrease, and the dripping of the surface mount adhesive was suppressed. As a result, it was possible to obtain a surface mount adhesive having a stably stored period of 180 days or more and good dispensing properties.

When zircon was contained, the thixotropy of the surface mount adhesive was maintained to some extent, but the storage stability (118 days) and the stably dispensed period days) were both insufficient.

These results have confirmed that it is important for the second filler to have a specific gravity of 1.7 to 4.5 and a revised Mohs hardness of 2 to 12.

Examples 5 to 8 and Comparative Examples 6 and 7

The weight ratio of the first filler to the second filler was examined.

In Examples 5 to 8 and Comparative Examples 6 and 7, the weight ratio of the base resin to the fillers was set to 2:1. Table 5 shows the weight ratios of the first filler to the second filler and the results.

TABLE 5

|  |  | Ex 5 | Ex 6 | Ex 7 | Ex 8 | Comp. Ex 6 | Comp. Ex 7 |
|---|---|---|---|---|---|---|---|
| Second filler |  | Alumina | | | | | |
| Filler weight ratio (Talc:Second filler) |  | 3:1 | 1:1 | 1:1.5 | 1:3 | 4:1 | 1:4 |
| Specific gravity of whole surface mount adhesive |  | 1.4 | 1.39 | 1.4 | 1.41 | 1.39 | 1.43 |
| Stably stored period (days) |  | 180 days or more | 180 days or more | 180 days or more | 180 days or more | 112 | 92 |
| Dispensing properties | Dripping, Clogging | None | None | None | None | NG (Clogging) | NG (Dripping) |
|  | Cp values | 2.11 | 2.02 | 2.48 | 1.99 | 0.82 | 0.78 |
|  | Number of dots with tailing | 1 | 0 | 1 | 0 | 4 | 7 |
|  | Number of dots with splashing | 0 | 0 | 0 | 0 | 8 | 12 |
| Stably dispensed period (days) |  | 21 | 25 | 28 | 24 | 2 | 3 |
| Comprehensive evaluation |  | Very good | Very good | Very good | Very good | Poor | Poor |

When the weight ratio of the first filler to the second filler was set to 1:4, the dripping of the surface mount adhesive was found due to decreased thixotropy. When the weight ratio of the first filler to the second filler was set to 4:1, the amount of the surface mount adhesive adhering to the nozzle increased and stable dispensing was not possible.

When the weight ratio of the first filler to the second filler was from 1:3 to 3:1, the thixotropy was suitably maintained, so the dripping of the surface mount adhesive was suppressed. Also, the adhesion of the surface mount adhesive to the nozzle was suppressed as well. As a result, it was possible to obtain surface mount adhesives having a stably stored period of 180 days or more and good dispensing properties.

Comparative Examples 8 to 10

The specific gravity of the whole surface mount adhesive was examined.

Alumina (largest particle size 10 μm) was used as the second filler. The weight ratio of the first filler to the second filler was set to 1:2. The weight ratio of the base resin to the total of the first filler and the second filler was set to 1:1, 2:1, 3:1, or 5:1, and evaluations were made. Table 6 shows the results.

TABLE 6

|  | Ex 2 | Comp. Ex 8 | Comp. Ex 9 | Comp. Ex 10 |
|---|---|---|---|---|
| Second filler | Alumina | | | |
| Base resin:fillers | 2:1 | 1:1 | 3:1 | 5:1 |
| Filler weight ratio (Talc:Second filler) | 1:2 | | | |
| Specific gravity of whole surface mount adhesive | 1.42 | 1.51 | 1.18 | 1.16 |
| Stably stored period (days) | 180 days or more | 28 | 180 days or more | 180 days or more |
| Dispensing properties — Dripping, Clogging | None | NG (Clogging) | NG (Dripping) | NG (Dripping) |
| Cp values | 2.13 | 0.56 | 0.24 | 0.32 |
| Number of dots with tailing | 0 | 11 | 8 | 12 |
| Number of dots with splashing | 1 | 24 | 126 | 184 |
| Stably dispensed period (days) | 22 | 0 | 0 | 0 |
| Comprehensive evaluation | Very good | Poor | Poor | Poor |

When the weight ratio of the base resin to the total of the first filler and the second filler was set to 3:1 or 5:1, the specific gravity of the whole surface mount adhesive was less than 1.2. These surface mount adhesives had a low dropping property, and thus stable dispensing was not possible.

When the weight ratio of the base resin to the total of the first filler and the second filler was set to 1:1, the specific gravity of the whole surface mount adhesive exceeded 1.5. Since the surface mount adhesive had a low filler dispersibility, filler sedimentation occurred in the surface mount adhesive, and thus stable dispensing was not possible.

When the weight ratio of the base resin to the total of the first filler and the second filler was set to 2:1, the specific gravity of the whole surface mount adhesive was 1.42, which is 1.2 or more and 1.5 or less (Example 2). As a result, it was possible to obtain a surface mount adhesive having an excellent dropping property and dispersibility, a stably stored period of 180 days or more, and good dispensing properties.

It should be noted that mixing two kinds of fillers satisfying the above-described characteristics, other than talc and alumina, can also provide a surface mount adhesive having essentially the same storage stability, dispensing properties, and continuous dispensing stability.

The surface mount adhesive of the invention and the mounting structure using the same can be used, for example, in household electric appliances such as liquid crystal panel displays, plasma displays, DVD recorders, DVD players, audio devices, rice cookers, microwave ovens, and lighting fixtures. In particular, in various electric and electronic devices whose circuit boards are fabricated using a flow solder connection process, the dispensing performance is enhanced, and the production cycle time is significantly improved.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A surface mount adhesive comprising:
   an epoxy resin;
   a curing agent;
   an accelerator;
   a first filler; and
   a second filler,
   wherein:
   the surface mount adhesive cures at 100° C. or less,
   the surface mount adhesive that has been cured has a glass transition point of from 30° C. to 100° C.,
   the second filler has a specific gravity 1.1 to 3 times that of the first filler,
   the second filler has a hardness higher than that of the first filler,
   the first filler has a largest particle size of 100 μm or less, and a mean particle size of 0.5 to 10 μm,
   the second filler has a largest particle size of 100 μm or less, and a mean particle size of 10 to 50 μm,
   the mean particle size of the first filler is different than the mean particle size of the second filler,
   the first filler has a revised Mohs hardness of 1 to 3, and the second filler has a revised Mohs hardness of 2 to 12, and
   the surface mount adhesive has a specific gravity of 1.2 to 1.5.

2. The surface mount adhesive in accordance with claim 1, wherein the first filler has a specific gravity of 1.5 to 3, and the second filler has a specific gravity of 1.7 to 4.5.

3. The surface mount adhesive in accordance with claim 1, wherein the epoxy resin is at least one selected from the group consisting of: bisphenol A epoxy resins, bisphenol F epoxy resins, novolac epoxy resins, alicyclic epoxy resins, glycidyl ester epoxy resins, and glycidyl amine epoxy resins.

4. A mounting structure comprising:
   a circuit board;
   an electronic component disposed on a predetermined area of the circuit board;
   the surface mount adhesive of claim 1 that is cured and disposed between the circuit board and the electronic component; and
   solder electrically connecting the circuit board with the electronic component.

5. A method for producing a mounting structure, comprising the steps of:
   dispensing the surface mount adhesive of claim 1 to a predetermined area of a circuit board;
   disposing an electronic component on the predetermined area of the circuit board having the surface mount adhesive; and
   heating the circuit board at a predetermined temperature to cure the surface mount adhesive.

6. A surface mount adhesive comprising:
an epoxy resin;
a curing agent;
an accelerator;
a first filler; and
a second filler,
wherein:
the surface mount adhesive cures at 100° C. or less,
the surface mount adhesive that has been cured has a glass transition point of from 30° C. to 100° C.,
the first filler has a largest particle size of 100 μm or less, and a mean particle size of 0.5 to 10 μm,
the second filler has a largest particle size of 100 μm or less, and a mean particle size of 10 to 50 μm,
the mean particle size of the first filler is different than the mean particle size of the second filler,
wherein the first filler is talc, and the second filler is alumina, and
the surface mount adhesive has a specific gravity of 1.2 to 1.5.

7. The surface mount adhesive in accordance with claim 6, wherein the epoxy resin is at least one selected from the group consisting of: bisphenol A epoxy resins, bisphenol F epoxy resins, novolac epoxy resins, alicyclic epoxy resins, glycidyl ester epoxy resins, and glycidyl amine epoxy resins.

8. A mounting structure comprising:
a circuit board;
an electronic component disposed on a predetermined area of the circuit board;
the surface mount adhesive of claim 6 that is cured and disposed between the circuit board and the electronic component; and
solder electrically connecting the circuit board with the electronic component.

9. A method for producing a mounting structure, comprising the steps of:
dispensing the surface mount adhesive of claim 6 to a predetermined area of a circuit board;
disposing an electronic component on the predetermined area of the circuit board having the surface mount adhesive; and
heating the circuit board at a predetermined temperature to cure the surface mount adhesive.

* * * * *